(12) United States Patent
Sekiya (10) Patent No.: US 12,211,731 B2
(45) Date of Patent: Jan. 28, 2025

(54) WAFER PROCESSING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 539 days.

(21) Appl. No.: 17/659,107

(22) Filed: Apr. 13, 2022

(65) Prior Publication Data

US 2022/0359259 A1 Nov. 10, 2022

(30) Foreign Application Priority Data

May 6, 2021 (JP) .................................. 2021-078315

(51) Int. Cl.
*H01L 21/683* (2006.01)
*H01L 21/67* (2006.01)
*H01L 21/673* (2006.01)
*H01L 21/677* (2006.01)

(52) U.S. Cl.
CPC .... *H01L 21/6836* (2013.01); *H01L 21/67161* (2013.01); *H01L 21/67389* (2013.01); *H01L 21/677* (2013.01)

(58) Field of Classification Search
CPC .............. H01L 21/6835; H01L 21/6836; H01L 2221/68304; H01L 2221/68318–68327
See application file for complete search history.

(56) References Cited

U.S. PATENT DOCUMENTS

| 2008/0233712 | A1* | 9/2008 | Sekiya | ................... H01L 24/83 257/E21.599 |
| 2012/0312468 | A1* | 12/2012 | Taga | .................. H01L 21/6836 156/538 |
| 2016/0307851 | A1* | 10/2016 | Ohura | ................. H01L 21/6836 |
| 2018/0019152 | A1* | 1/2018 | Kim | .................... H01L 21/6836 |
| 2018/0096892 | A1* | 4/2018 | Sandoh | ............... H01L 21/3065 |

FOREIGN PATENT DOCUMENTS

JP 2009246098 A 10/2009

* cited by examiner

*Primary Examiner* — Carson Gross
(74) *Attorney, Agent, or Firm* — Greer Burns & Crain Ltd.

(57) ABSTRACT

A wafer processing method includes a wafer accommodating step of accommodating a wafer in a vacuum chamber, a protective sheet disposing step of disposing a protective sheet on a front surface of the wafer, a decompression step of decompressing the inside of the vacuum chamber, after the wafer accommodating step and the protective sheet disposing step, a press-fitting step of pressing the protective sheet against a peripheral marginal area of the wafer in the vacuum chamber to press-fit the protective sheet to the peripheral marginal area, after the decompression step, and a conveying-out step of opening the vacuum chamber to atmosphere to bring the protective sheet into close contact with the front surface of the wafer by atmospheric pressure and conveying out the wafer, after the press-fitting step.

4 Claims, 6 Drawing Sheets

WAFER PROCESSING METHOD

BACKGROUND OF THE INVENTION

Field of the Invention

The present invention relates to a wafer processing method.

Description of the Related Art

A wafer formed on a front surface thereof with a device area in which devices such as integrated circuits (ICs), large-scale integration (LSI), and micro electro mechanical systems (MEMS) are partitioned by a plurality of intersecting projected dicing lines (streets) is ground on a back surface to a predetermined thickness, and is thereafter divided into individual device chips by a dicing apparatus or a laser processing apparatus, and the thus divided device chips are used for electrical apparatuses such as mobile phones and personal computers.

In grinding the back surface to thin the wafer, a protective sheet is preliminarily disposed on a front surface of the wafer such that the devices on the front surface held by a chuck table are not damaged (see, for example, Japanese Patent Laid-open No. 2009-246098).

Incidentally, in a wafer formed with a plurality of MEMS in the device area, the MEMS are protruded upward by approximately 100 µm, the electrode pads of the MEMS and the streets are formed in areas recessed between the adjacent MEMS, and, due to steps formed between the MEMS, the electrode pads, and the streets, it is difficult to appropriately dispose the protective sheet under atmospheric pressure. Therefore, the protective sheet is press-fitted to a peripheral marginal area surrounding the device area of the wafer in a vacuum chamber, and thereafter, the vacuum chamber is opened to the atmosphere, and the protective sheet is brought into close contact with the front surface of the wafer by the atmospheric pressure.

SUMMARY OF THE INVENTION

However, in the case of using the vacuum chamber to bring the protective sheet into close contact with the front surface of the wafer by atmospheric pressure as described above, the protective sheet enters deep into a recessed area of the wafer, and a high pressure is applied due to the atmospheric pressure, so that there is a problem that the protective sheet is broken in a fiber form at the part where the above-described steps are formed. This is not limited to MEMS, and any wafer having a step on the front surface, even a wafer formed with ICs, LSI, or the like, can face this problem.

In addition, in grinding the back surface of the wafer, a flattening sheet is disposed over the upper surface of the protective sheet through a flexible sheet. When the flexible sheet and the flattening sheet are peeled off together with the protective sheet from the front surface of the wafer after the back surface of the wafer is ground, a problem that the electrode pad formed in the recessed area is deformed due to breakage of the protective sheet also occurs.

Accordingly, it is an object of the present invention to provide a wafer processing method capable of dissolving a problem that the protective sheet put into close contact with the front surface of the wafer by atmospheric pressure by using the vacuum chamber is broken due to steps on the front surface and dissolving a problem that the electrode pad is deformed at the time of peeling off the protective sheet from the front surface of the wafer after the back surface of the wafer is ground.

In accordance with an aspect of the present invention, there is provided a wafer processing method for processing a wafer including a device area and a peripheral marginal area surrounding the device area, the device area having a plurality of protruded devices partitioned by a plurality of recessed intersecting streets, the wafer having a front surface in which a step is present between the devices and the streets. The wafer processing method includes a wafer accommodating step of accommodating the wafer in a vacuum chamber, a protective sheet disposing step of disposing a protective sheet on the front surface of the wafer before or after the wafer accommodating step, a decompression step of decompressing an inside of the vacuum chamber, after the wafer accommodating step and the protective sheet disposing step, a press-fitting step of pressing the protective sheet against the peripheral marginal area of the wafer in the vacuum chamber to press-fit the protective sheet to the peripheral marginal area, after the decompression step, and a conveying-out step of opening the vacuum chamber to atmosphere to bring the protective sheet into close contact with the front surface of the wafer by atmospheric pressure and conveying out the wafer, after the press-fitting step. In the protective sheet disposing step, the recessed streets are filled with water, and the protective sheet disposed on the wafer to be conveyed out in the conveying-out step is restrained from being embedded in the recessed streets by the atmospheric pressure.

Preferably, the protective sheet includes an adhesive layer in an area corresponding to the peripheral marginal area of the wafer. Preferably, the wafer processing method further includes a flattening step of disposing a flattening sheet over an upper surface of the protective sheet through a flexible sheet, after the conveying-out step. Preferably, the wafer processing method further includes a grinding step of holding a protective sheet side of the wafer on a chuck table and grinding a back surface of the wafer to thin the wafer, after the conveying-out step.

According to the present invention, a problem that the protective sheet enters a recessed area and cannot endure atmospheric pressure to be broken in a fiber form is dissolved. In addition, a problem that the electrode pad is deformed at the time of peeling off the protective sheet from the front surface of the wafer after the back surface of the wafer is ground is also dissolved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
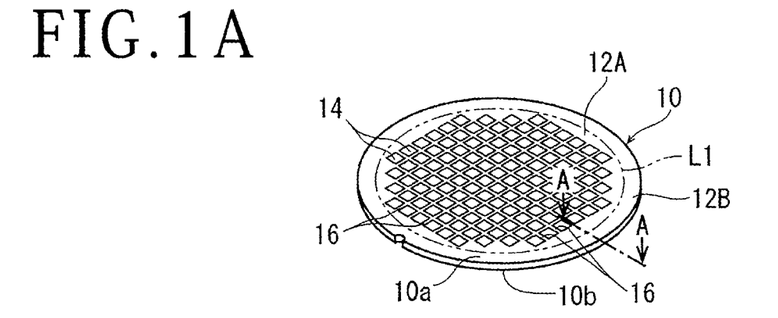
FIG. 1A is a perspective view of a wafer to be processed in the present embodiment.
Figure 1B:
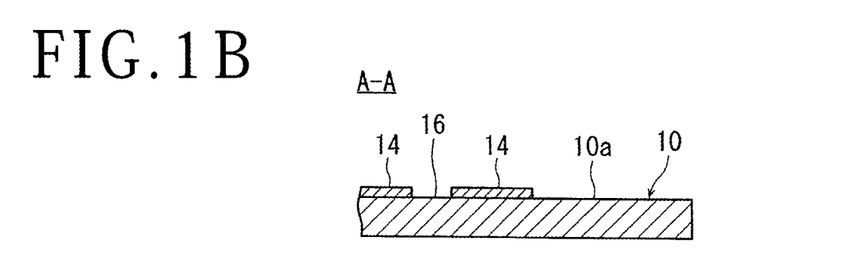
FIG. 1B is a sectional view taken along line A-A of the wafer depicted in FIG. 1A.

A wafer processing method according to an embodiment of the present invention will be described in detail below referring to the attached drawings. To carry out the wafer processing method of the present embodiment, first, a wafer 10 as depicted in FIG. 1A is prepared as a workpiece. The wafer 10 includes a device area 12A in which a plurality of devices 14 are formed on a front surface 10a partitioned by a plurality of intersecting streets 16 and a peripheral marginal area 12B surrounding the device area 12A (a broken line L1 dividing the device area 12A and the peripheral marginal area 12B is a virtual line depicted for the convenience' sake of description). As understood from a cross section taken along line A-A of FIG. 1A depicted in FIG. 1B, the plurality of devices 14 formed in the device area 12A are protruded and are partitioned by recessed streets 16, and steps are present between the devices 14 and the streets 16.

Figure 2:
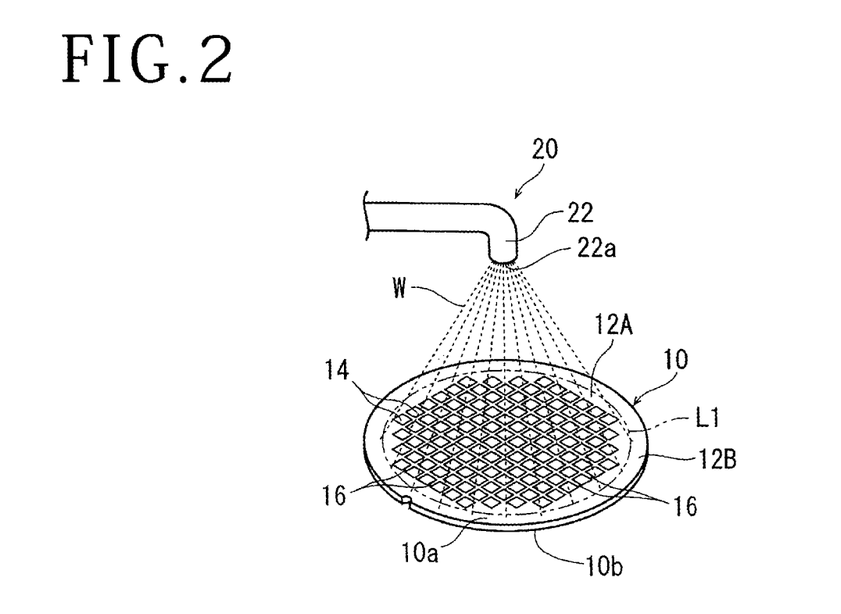
FIG. 2 is a perspective view depicting the manner of filling streets of the wafer depicted in FIG. 1A with water.

In the wafer processing method of the present embodiment, a protective sheet disposing step described below is conducted, and in the protective sheet disposing step, the recessed streets 16 on the front surface 10a of the wafer 10 are filled with water. More specifically, water supply means 20 as depicted in FIG. 2 is prepared, and a jet port 22a of a water supply nozzle 22 is positioned at the center of the front surface 10a of the wafer 10. Next, water W in the form of mist is jetted from the jet port 22a of the water supply nozzle 22, to supply water onto the front surface 10a. The amount of water W is at least an amount with which the streets 16 forming the recesses in the front surface 10a of the wafer 10 are filled, and is such an amount as to be held on the front surface 10a by surface tension.

Figure 3:
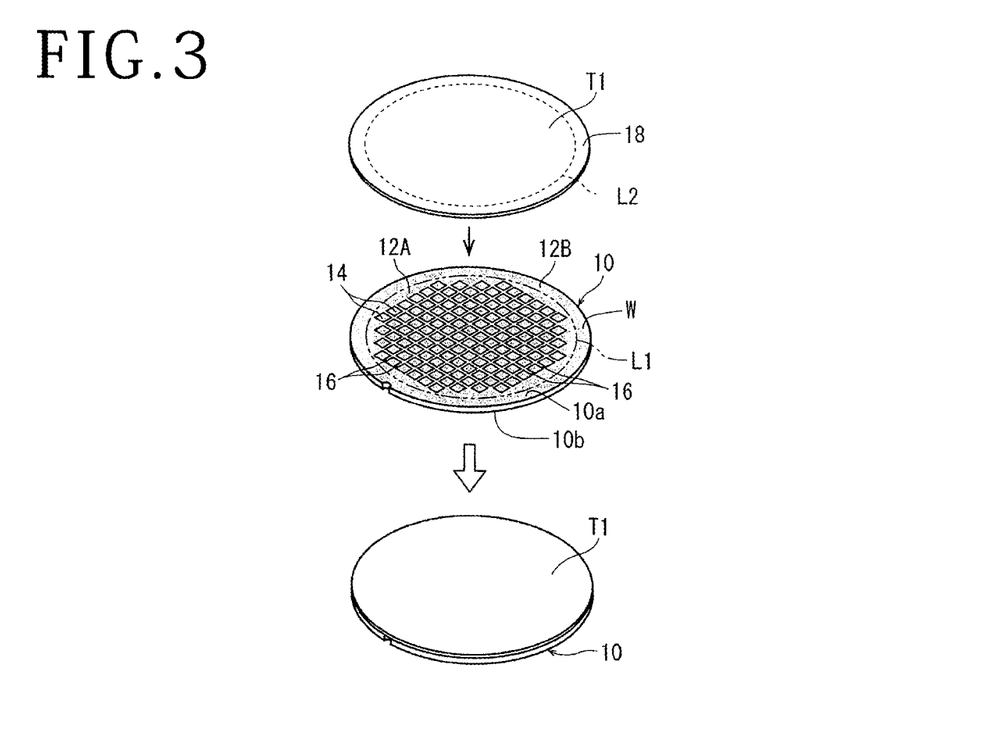
FIG. 3 is a perspective view depicting the manner of performing a protective sheet disposing step.

When the water W is supplied to the front surface 10a of the wafer 10 as described above, a protective sheet T1 is disposed on the front surface 10a of the wafer 10 where the water W is held, as depicted in FIG. 3 (protective sheet disposing step). As the protective sheet T1, for example, a typical resin-made background tape can be adopted. In a surface (lower surface) of the protective sheet T1, which is to be affixed to the wafer 10, an adhesive layer is formed on a peripheral area 18 (outside area partitioned by a broken line L2) corresponding to the peripheral marginal area 12B of the wafer 10, whereas the adhesive layer is not formed in the inside area corresponding to the device area 12A surrounded by the peripheral area 18.

Figure 4:
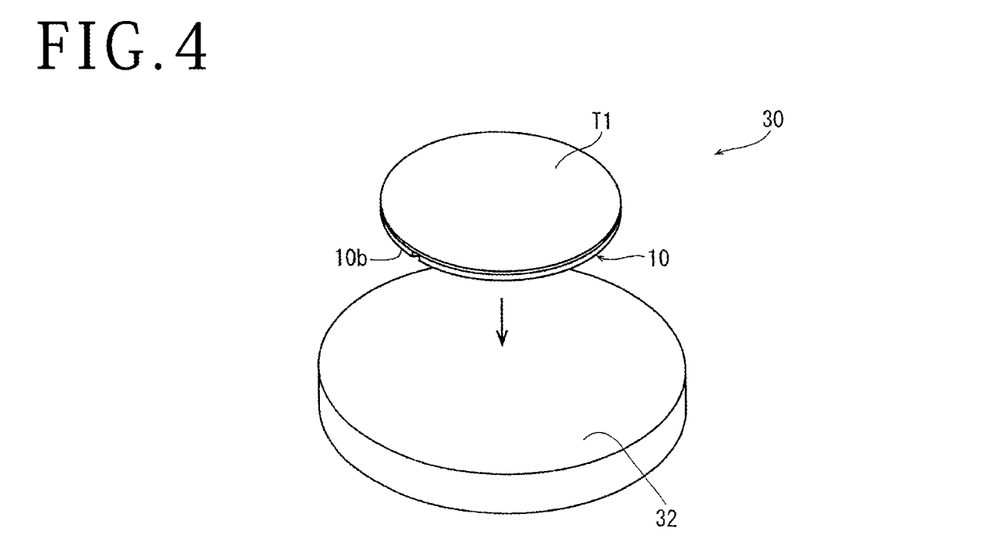
FIG. 4 is a perspective view depicting the manner of performing a wafer accommodating step.

When the protective sheet T1 is disposed on the front surface 10a of the wafer 10 where the water W is held as depicted in FIG. 3, the wafer 10 is conveyed to a vacuum chamber 30 (only part of which is illustrated) depicted in FIG. 4, and is accommodated in the vacuum chamber 30 (wafer accommodating step). In accommodating the wafer 10 in the vacuum chamber 30, the wafer 10 is positioned on a press-fitting table 32 in the vacuum chamber 30, with the protective sheet T1 directed upward and with a back surface 10b side of the wafer 10 directed downward, such that the center of the press-fitting table 32 and the center of the wafer 10 coincide with each other. Note that in the above embodiment, the protective sheet disposing step is conducted before the wafer accommodating step is carried out, but the present invention is not limited to this, and the protective sheet disposing step may be performed in the vacuum chamber 30 after the wafer accommodating step is carried out.

Figure 5A:
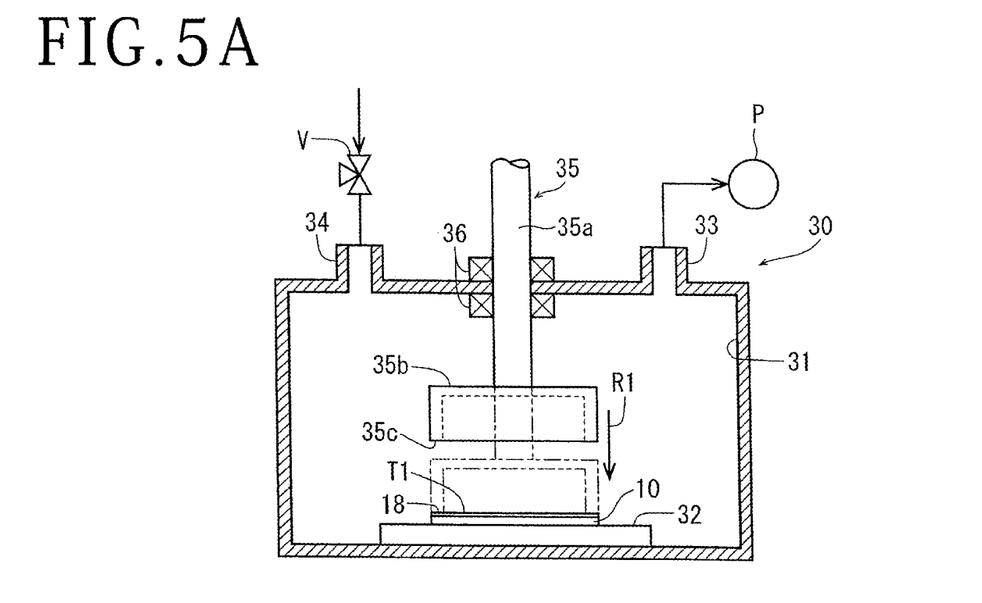
FIG. 5A is a partially sectional side view of a vacuum chamber in which a decompression step and a press-fitting step are to be carried out.

With reference to FIG. 5A, the vacuum chamber 30 will be described more specifically. The vacuum chamber 30 includes a chamber case 31 (for convenience' sake, depicted in sectional view) where the press-fitting table 32 is disposed, and an intake port 33, an opening port 34, and pressing means 35 are disposed at upper parts of the chamber case 31. The intake port 33 is connected to a vacuum pump P, and the opening port 34 is opened to the atmosphere through an on-off valve V. To decompress the air in the vacuum chamber 30 and to bring the inside of the vacuum chamber 30 into a vacuum state, the on-off valve V is closed and the vacuum pump P is operated. At the time of cancelling the vacuum state of the inside of the vacuum chamber 30, the on-off valve V is gradually opened to introduce the atmosphere.

The pressing means 35 includes a drive shaft 35a that is disposed in the center of an upper part of the vacuum chamber 30 and extends vertically penetrating the chamber case 31, and a pressing section 35b having an annular opening edge section 35c disposed at a lower end part of the drive shaft 35a and opened downward. At an upper part of the drive shaft 35a, unillustrated lifting-lowering means for lifting and lowering the pressing section 35b in the vertical direction is disposed. The drive shaft 35a is supported by a bearing 36 disposed in the chamber case 31. The bearing 36 is a bearing that permits vertical movement of the drive shaft 35a while sealing a space between the inside and the outside of the chamber case 31.

The pressing means 35 is disposed such that the center of the annular opening edge section 35c constituting the pressing section 35b and the center of the press-fitting table 32 coincide with each other when viewed in plan, and the opening edge section 35c is formed, in shape and size, corresponding to the peripheral marginal area 12B of the wafer 10.

When the protective sheet disposing step and the wafer accommodating step are carried out as described above, the vacuum pump P is operated in a state in which the on-off valve V is closed, to decompress the inside of the vacuum chamber 30 (decompression step).

Figure 5B:
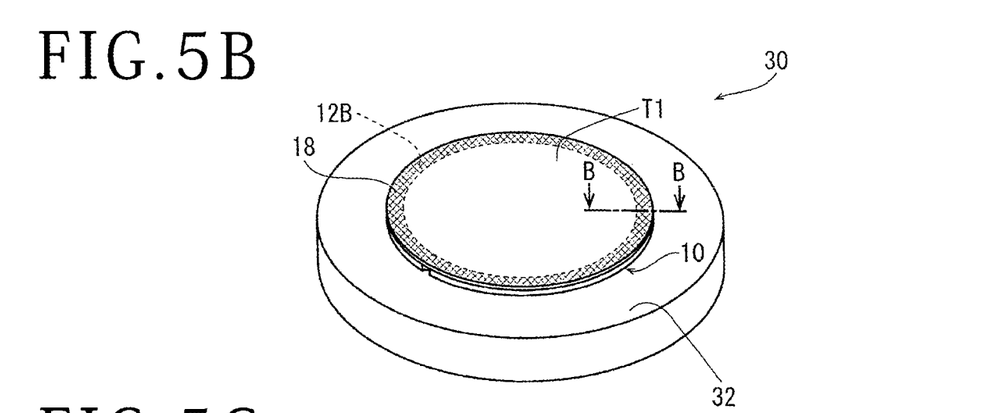
FIG. 5B is a perspective view of the wafer and the protective sheet that have undergone the press-fitting step.
Figure 5C:
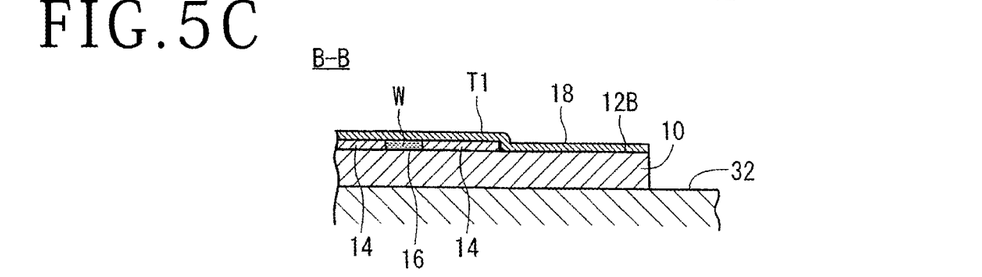
FIG. 5C is a sectional view taken along line B-B of FIG. 5B.

Next, the lifting-lowering means is operated, the pressing section 35b is lowered in the direction of an arrow R1 relative to the wafer 10 placed on the press-fitting table 32 in the vacuum chamber 30, and the opening edge section 35c of the pressing section 35b is pressed against the peripheral area 18 of the protective sheet T1 disposed on the wafer 10. The opening edge section 35c of the pressing section 35b is formed, in shape and size, corresponding to the peripheral marginal area 12B of the wafer 10 as described above, and, as depicted in FIG. 5B, the peripheral area 18 of the protective sheet T1 is press-fitted to the peripheral marginal area 12B of the wafer 10 (press-fitting step). The adhesive layer is formed on a lower surface side of the peripheral area 18 of the protective sheet T1, and the peripheral marginal area 12B of the wafer 10 and the peripheral area 18 of the protective sheet T1 are firmly affixed to each other. As a result, as depicted in FIG. 5C, the water W filling the streets 16 present between the adjacent devices 14 formed on the front surface 10a of the wafer 10 is enclosed by the protective sheet T1.

Note that in the above embodiment, the adhesive layer formed on the lower surface of the peripheral area 18 of the protective sheet T1 is pressed from above to press-fit the protective sheet T1 to the front surface 10a of the wafer 10, but the present invention is not limited to this. For example, the protective sheet T1 may be constituted of a thermocompression bonding sheet exhibiting an adhesive force when heated, heating means may be disposed at the pressing section 35b of the pressing means 35, and the press-fitting step may be conducted by thermocompression bonding, from above, of the peripheral area 18 of the protective sheet T1.

After the press-fitting step, the operation of the vacuum pump P is stopped, the on-off valve V connected to the opening port 34 depicted in FIG. 5A is gradually opened, and the lifting-lowering means is operated to lift the pressing section 35b. As a result, atmospheric air is introduced into the vacuum chamber 30, the protective sheet T1 is brought into close contact with the front surface 10a of the wafer 10 by the atmospheric pressure, and the wafer 10 is conveyed out from the vacuum chamber 30 (conveying-out step).

Figure 6:
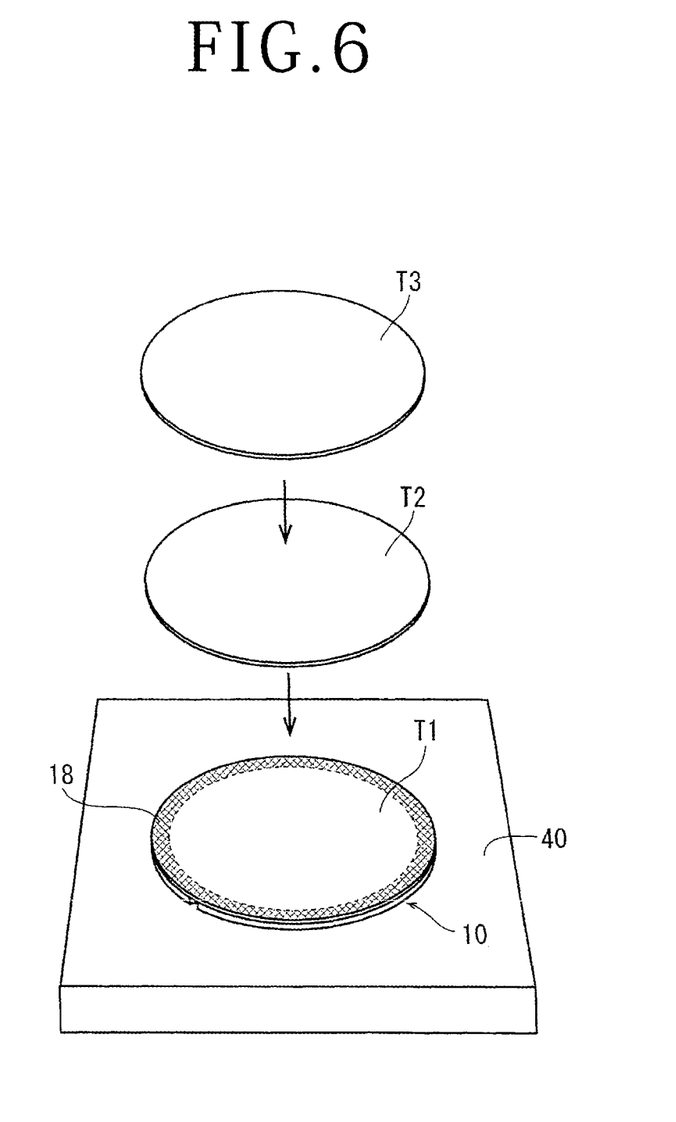
FIG. 6 is a perspective view depicting the manner of performing a flattening step.

In the present embodiment, the wafer 10 conveyed out from the vacuum chamber 30 as described above is placed on an appropriate working table 40 as depicted in FIG. 6, and a flexible sheet T2 for absorbing ruggedness of the front surface 10a of the wafer 10 is disposed on the protective sheet T1 that is in close contact with the wafer 10. A flattening sheet T3 is also disposed on the protective sheet T1 through the flexible sheet T2. In the case of disposing the flexible sheet T2 and the flattening sheet T3 on the protective sheet T1, for example, a member having fluidity and adhesiveness can be adopted as the flexible sheet T2, and, for example, a hard resin sheet can be adopted as the flattening sheet T3. The flexible sheet T2 is not limited to the one which is in a sheet form from the beginning, and may be one which is formed in a sheet form by application of a liquid resin to the protective sheet T1.

Figure 7A:
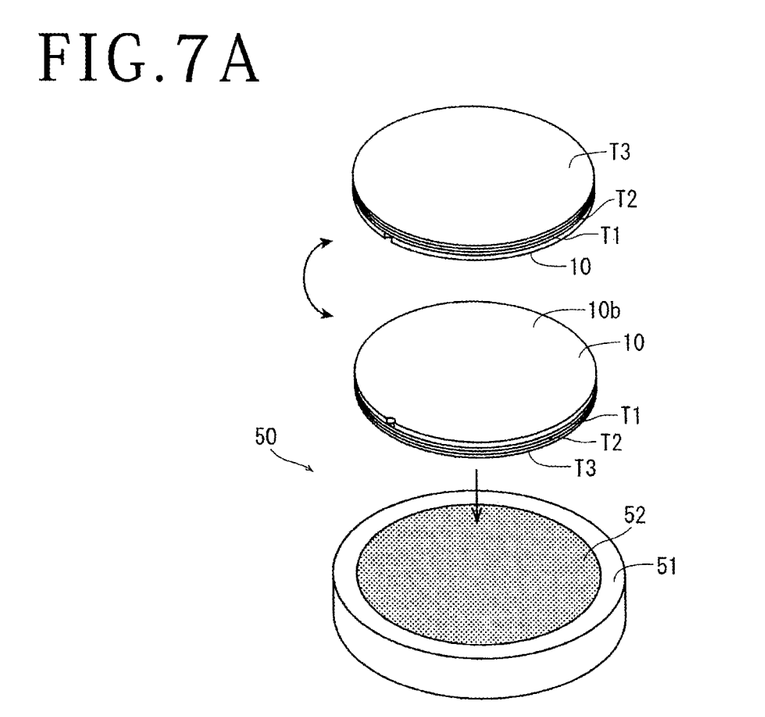
FIG. 7A is a perspective view depicting the manner of placing the wafer on a chuck table of a grinding apparatus.

In the present embodiment, further, after the flattening step is performed, a grinding step of grinding the back surface 10b of the wafer 10 to thin the wafer 10 is conducted. More specifically, the wafer 10 to which the protective sheet T1, the flexible sheet T2, and the flattening sheet T3 are affixed is conveyed to a grinding apparatus 50 (only part of which is illustrated) depicted in FIG. 7A. The grinding apparatus 50 includes a chuck table 51 including a holding surface 52. The chuck table 51 includes rotational drive means omitted in illustration. The holding surface 52 of the chuck table 51 is formed of a member having gas permeability and is connected with suction means omitted in illustration, and a negative pressure is generated on the holding surface 52 by operation of the suction means. The wafer 10 conveyed to the grinding apparatus 50 is reversed as depicted in FIG. 7A, and is placed and held under suction on the chuck table 51, with a flattening sheet T3 side directed downward and with the back surface 10b side of the wafer 10 directed upward.

Figure 7B:
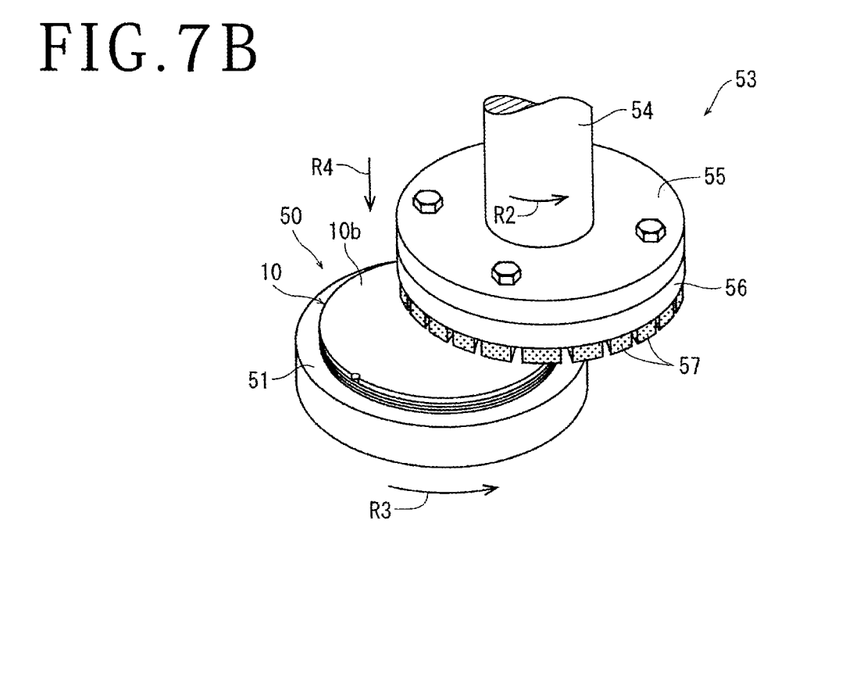
FIG. 7B is a perspective view depicting the manner of performing a grinding step.

The grinding apparatus 50 includes grinding means 53 as depicted in FIG. 7B. The grinding means 53 includes a rotating spindle 54 rotated by a rotational drive mechanism omitted in illustration, a wheel mount 55 mounted to a lower end of the rotating spindle 54, and a grinding wheel 56 attached to a lower surface of the wheel mount 55. A plurality of grindstones 57 are disposed in an annular pattern on a lower surface of the grinding wheel 56.

When the wafer 10 is held under suction on the chuck table 51, the rotating spindle 54 of the grinding means 53 is rotated in the direction indicated by an arrow R2 in FIG. 7B at, for example, 6,000 rpm, and the chuck table 51 is rotated in the direction indicated by an arrow R3 at, for example, 300 rpm. Then, while grinding water is supplied onto the back surface 10b of the wafer 10 by grinding water supply means not illustrated, the grindstones 57 are brought into contact with the back surface 10b of the wafer 10, and the grinding wheel 56 is put into grinding feeding in the direction (downward) indicated by an arrow R4 at a speed of, for example, 1.0 μm/s. In this instance, grinding can be progressed while the grinding amount of the wafer 10 is measured by a contact-type measurement gauge not illustrated. When the back surface 10b of the wafer 10 is ground by a predetermined amount to thin the wafer 10 to a predetermined thickness, the grinding means 53 is stopped, and the grinding step is completed through cleaning, drying, and the like.

Figure 8:
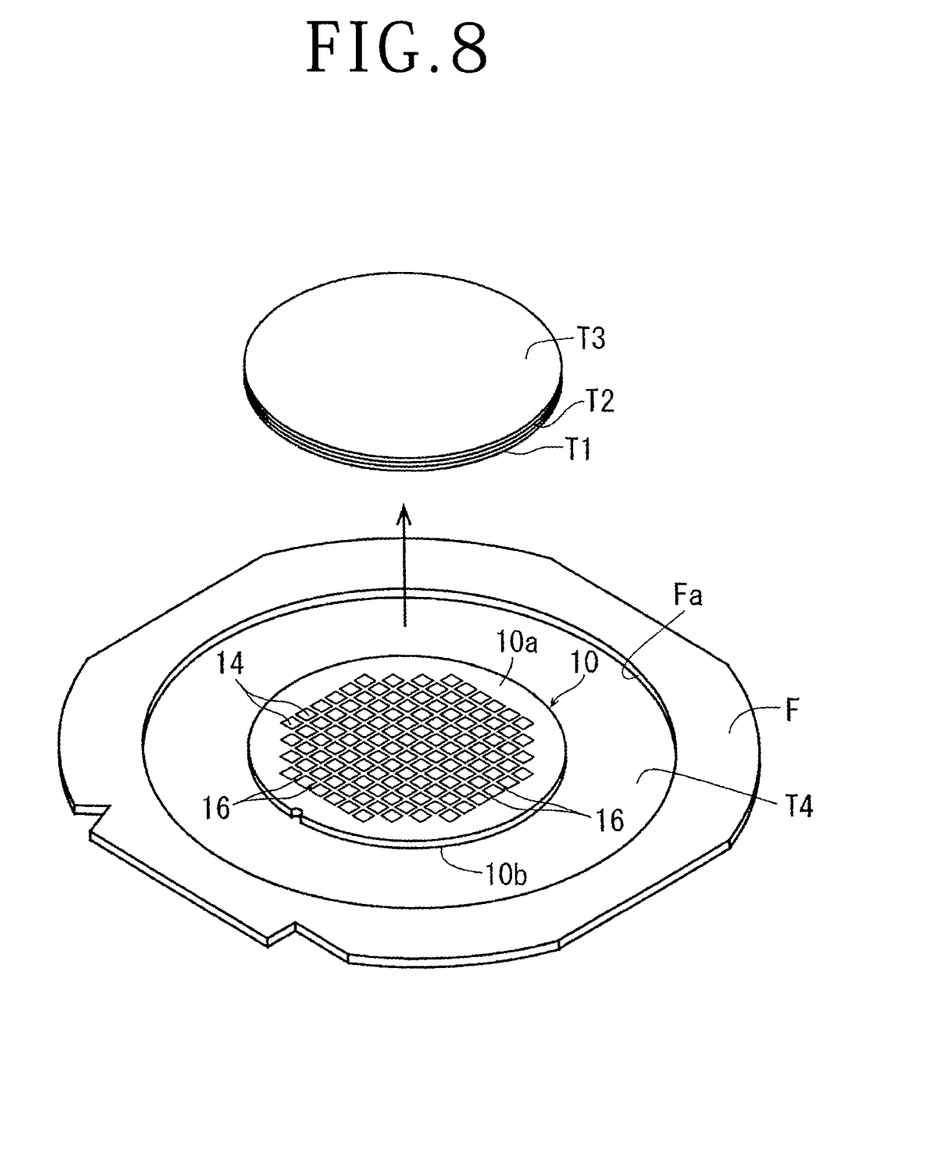
FIG. 8 is a perspective view depicting the manner of peeling off the protective sheet, a flexible sheet, and a flattening sheet from the wafer.

When the grinding step is completed, as depicted in FIG. 8, the wafer 10 is positioned at an opening Fa of an annular frame F, the opening Fa being capable of accommodating the wafer 10, with the back surface 10b side of the wafer 10 directed downward, is affixed to an adhesive tape T4, and is held by the frame F through the adhesive tape T4. Thereafter, the protective sheet T1, the flexible sheet T2, and the flattening sheet T3 are peeled off from the front surface 10a of the wafer 10, to expose the front surface 10a. When the front surface 10a is exposed, the water W filling the front surface 10a is removed as appropriate, the wafer 10 held by the frame F is conveyed to a dicing apparatus or a laser processing apparatus, and a dividing step of dividing the wafer 10 into individual device chips is carried out.

According to the above embodiment, at the time of carrying out the protective sheet disposing step of disposing the protective sheet T1 on the front surface 10a of the wafer 10, the recessed streets 16 formed between the adjacent devices 14 are filled with the water W. Then, the protective sheet T1 is disposed on the adjacent devices 14, and the protective sheet T1 is put into close contact with the front surface 10a of the wafer 10 by the atmospheric pressure. Therefore, the protective sheet T1 is restrained from being embedded in the recessed streets 16 by the atmospheric pressure, solving the problem that the protective sheet T1 enters the recessed area, cannot endure the atmospheric pressure, and is broken in a fiber form.

In addition, in the above embodiment, since the protective sheet T1 is disposed on the front surface 10a of the wafer 10 and the flattening step of disposing the flattening sheet T3 over the upper surface of the protective sheet T1 through the flexible sheet T2 is conducted, the ruggedness of the front surface 10a of the wafer 10 is absorbed by the flexible sheet T2 and the front surface 10a side is supported flat, so that the back surface 10b of the wafer 10 can be ground uniformly. In addition, since the protective sheet T1 is not broken in a fiber form, as described above, even if an electrode pad is present in the streets 16, the problem that the electrode pad is deformed at the time of peeling off the protective sheet T1 from the front surface 10a of the wafer 10 is dissolved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer including a device area and a peripheral marginal area surrounding the device area, the device area having a plurality of protruded devices partitioned by a plurality of recessed intersecting streets, the wafer having a front surface in which a step is present between the devices and the streets, the wafer processing method comprising:
- a wafer accommodating step of accommodating the wafer in a vacuum chamber;
- a protective sheet disposing step of disposing a protective sheet on the front surface of the wafer before or after the wafer accommodating step;
- a decompression step of decompressing an inside of the vacuum chamber, after the wafer accommodating step and the protective sheet disposing step;
- a press-fitting step of pressing the protective sheet against the peripheral marginal area of the wafer in the vacuum chamber to press-fit the protective sheet to the peripheral marginal area, after the decompression step; and
- a conveying-out step of opening the vacuum chamber to atmosphere to bring the protective sheet into close contact with the front surface of the wafer by atmospheric pressure and conveying out the wafer, after the press-fitting step, wherein, in the protective sheet disposing step, the recessed streets are filled with water, and the protective sheet disposed on the wafer to be conveyed out in the conveying-out step is restrained from being embedded in the recessed streets by the atmospheric pressure.

2. The wafer processing method according to claim 1, wherein the protective sheet includes an adhesive layer in an area corresponding to the peripheral marginal area of the wafer.

3. The wafer processing method according to claim 1, further comprising:
- a flattening step of disposing a flattening sheet over an upper surface of the protective sheet through a flexible sheet, after the conveying-out step.

4. The wafer processing method according to claim 1, further comprising:
- a grinding step of holding a protective sheet side of the wafer on a chuck table and grinding a back surface of the wafer to thin the wafer, after the conveying-out step.

* * * * *